United States Patent [19]
Ishii et al.

[11] Patent Number: 5,236,181
[45] Date of Patent: Aug. 17, 1993

[54] VERTICAL HEAT TREATING APPARATUS

[75] Inventors: Katsumi Ishii, Fujino; Takanobu Asano, Yokohama; Masaharu Abe, Sagamihara, all of Japan

[73] Assignee: Tokyo Electron Sagami Limited, Kanagawa, Japan

[21] Appl. No.: 765,890

[22] Filed: Sep. 26, 1991

[30] Foreign Application Priority Data

Sep. 26, 1990 [JP] Japan .................................. 2-256160
Nov. 30, 1990 [JP] Japan .................................. 2-335661

[51] Int. Cl.⁵ .............................................. F27D 3/12
[52] U.S. Cl. ..................................... 266/252; 432/241
[58] Field of Search ................ 266/249, 252; 432/241, 432/239, 253, 153, 5, 6

[56] References Cited

U.S. PATENT DOCUMENTS

| | | | |
|---|---|---|---|
| 4,459,104 | 7/1984 | Wollmann | 432/239 X |
| 4,468,195 | 8/1984 | Sasaki et al. | 432/239 |
| 4,610,628 | 9/1986 | Mizushina | 432/241 |
| 4,669,983 | 6/1987 | Hayward | 432/253 X |
| 4,738,618 | 4/1988 | Massey et al. | 432/241 |
| 4,938,691 | 7/1990 | Ohkase et al. | 432/253 X |
| 4,954,684 | 9/1990 | Aoki et al. | 219/411 X |
| 4,976,613 | 12/1990 | Watanabe | 432/241 |
| 4,981,436 | 1/1991 | Watanabe | 432/241 |

Primary Examiner—Scott Kastler
Attorney, Agent, or Firm—Oblon, Spivak, McClelland, Maier & Neustadt

[57] ABSTRACT

A vertical heating apparatus comprises a casing having an opening through which a plurality of transport members receiving articles to be processed are loaded in and unloaded from the casing, a heat treating furnace provided in an upper portion of the casing, a transport member storing portion provided in the casing at a side space of the heat treating furnace, for receiving the transport members, a processing member for transporting the articles to be processed in the heat treating furnace, a transferring mechanism for transferring the articles to be processed and received by the transport members to the processing member, and a vertically moving mechanism provided below the heat treating furnace in the casing, for loading and unloading the articles to be processed and received by the processing member in and from the heat treating furnace.

23 Claims, 8 Drawing Sheets

VERTICAL HEAT TREATING APPARATUS

BACKGROUND OF THE INVENTION

1. Field of the Invention

This invention relates to a vertical heat treating apparatus used in a diffusion process and/or a film formation process for manufacturing semiconductor devices.

2. Description of the Related Art

Vertical heat treating apparatuses, which have recently been used in a diffusion process and/or a film formation process for manufacturing semiconductor devices, have begun to be used in a ductless atmosphere and to be reduced in floor space.

The vertical heat treating apparatus of this type has an evenly heating tube, a heater, a heat treating furnace made of heat insulting material and vertically provided in a casing. In the lower portion of the casing is mounted a vertical moving mechanism (boat elevator) for loading/unloading processing members (wafer boats) on which semiconductor wafers as articles to be processed are mounted.

Some vertical heat treating apparatuses each have a transport device for transporting wafers from transporting members (wafer cassettes) which transport the wafers to the processing member.

The use of such a vertical heat treating apparatus makes the floor space smaller than a vertical heat treating apparatus, and the loading/unloading of wafers, which is easily performed in a non-contacting state of the wafers with a reaction tube in the furnace, renders the interior of the furnace dustless.

However, there is a tendency that the diameter of semiconductor wafers has become larger and larger while the circuit pattern of semiconductor devices has become finer and finer. It is requested, therefore, that vertical heat treating apparatuses ensure that dust is prevented from being attached to articles to be processed so as to give a high yield, and their floor space be made as small as possible even though wafers to be processed have a large diameter.

SUMMARY OF THE INVENTION

The object of this invention is to provide a vertical heat treating apparatus which ensures that dust is prevented from being attached to articles to be processed and whose floor space is reduced to a minimum.

In order to attain the object, a vertical heat treating apparatus according to this invention comprises a casing having an opening through which a plurality of transporting members for holding articles to be processed are transported, a heat treating furnace provided in an upper portion of the casing, a transport member storing unit provided at a side space of the heat treating furnace in the casing so as to store the transport members, heat treating members for moving the articles to be processed in the heat treating furnace, a transferring mechanism for transferring the articles to be processed on the transport members to the treatment member, and a vertically moving mechanism for loading and unloading the articles to be processed held in the processing members.

Heat treatment is performed after the transport members have been transported by means of a transporting mechanism and semiconductor wafers have been moved from the transport members to the processing members by means of the transferring mechanism.

In the conventional vertical heat treating apparatus, a side portion of the heat treating furnace in the casing is a dead space. In the vertical heat treating apparatus according to this invention, the transport member holding portion is provided in the space so as to reduce the dead space. In particular, in the heat treating apparatus which processes wafers having a large diameter such as 8 inches, the transport member holding unit becomes bulky, resulting in remarkable reduction of the floor space.

Since the transport member holding unit is provided in that upper portion in the casing where the atmosphere is cleaner than the atmosphere in the lower portion of the casing, wafers are put in a relatively clean atmosphere, whereby dust is rarely attached to the wafers.

Further, a fan and a dust filter are provided in the transport member holding unit. Air cleaned through the filter is caused to flow on the transporting members put in the transport member holding unit such that dust is rarely attached to the wafers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

An embodiment of this invention will now be explained with reference to the drawings.

The embodiment relates to a vertical heat treating apparatus which can process semiconductor wafers having a diameter of 8 inches.

Figure 1:
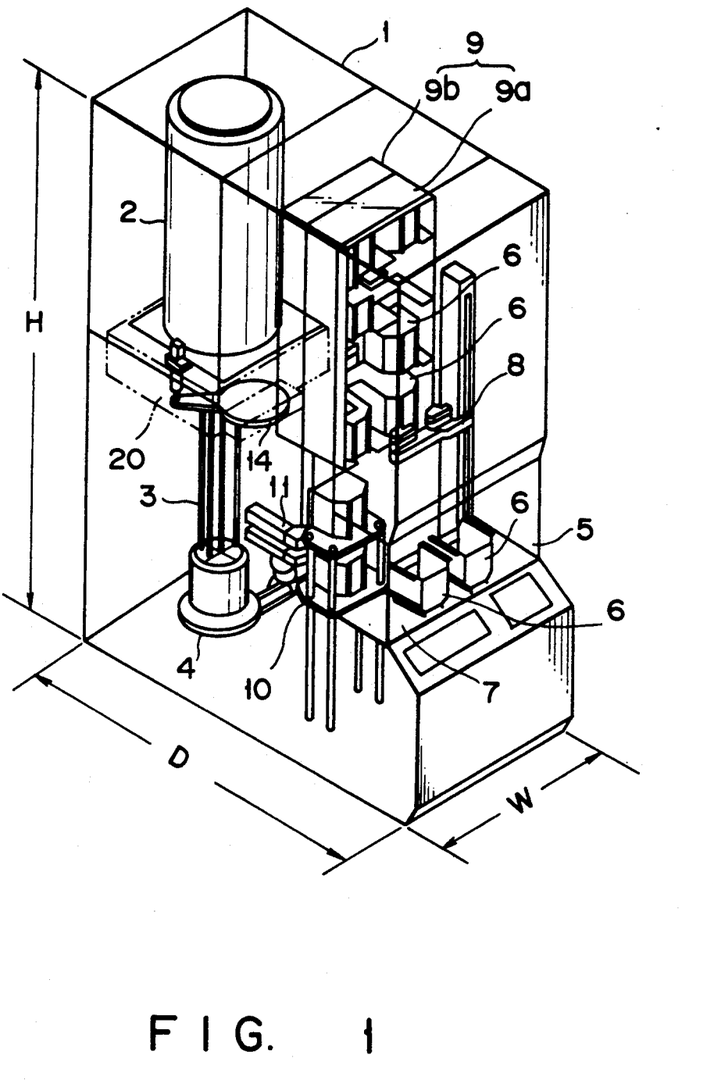
FIG. 1 is a perspective view of one embodiment of a vertical heat treating apparatus according to this invention.

As shown in FIG. 1, a casing 1 is made from iron plates into a substantially box shape. For instance, its width (W), its depth (D) and its height (H) are substantially 100 cm, 200 cm and 280 cm, respectively.

In the rear upper portion of the casing 1 is provided a substantially upright heat treating furnace 2 which comprises an evenly heating tube, a heater, heat insulating material and the like. In the lower portion of the casing 1 is provided a boat elevator 4 for loading a wafer boat 3, on which semiconductor wafers (articles to be treated and not shown), are mounted, in and unloading the same from the heat treating furnace 2.

In the front face of the casing 1 is formed an opening 5 provided with a door (not shown), through which wafer cassettes 6 containing the semiconductor wafers are transported in and from the casing 1.

In this embodiment, the opening 5 is provided with a carrier I/O port 7 on which two wafer cassettes 6 can be substantially horizontally mounted at a time in such a state that semiconductor wafers are disposed vertically. Behind the carrier I/O poat 7 is provided a first robot arm 8 for transporting the wafer cassettes 6. The carrier I/O poat 7 is provided with a wafer arranging mechanism (not shown) for arranging the semiconductor wafers in the wafer cassettes 6 by using an orientation flat (not shown) and a horizontal-vertical direction changing mechanism (not shown) for rotating the wafer cassettes 6 from the horizontal posture to the vertical posture and vice versa. For example, all of orientation flats of the wafers are directed upward by the wafer arranging mechanism. After the semiconductor wafers in the wafer cassettes 6 have been arranged in the predetermined direction by means of the wafer arranging mechanism, the wafer cassettes 6 are rotated through 90° by means of the horizontal-vertical direction changing mechanism so as to take a vertical state (that is, such that the semiconductor wafers are disposed horizontally). Thereafter, the wafer cassettes 6 are moved to a carrier stage 9 by means of the first robot arm 8. The carrier stage 9 is provided in the upper portion behind the first robot arm 8, and a transfer stage 10 is provided in the lower portion behind the first robot arm 8. Behind the transfer stage 10 is disposed a second robot arm 11 for transferring the semiconductor wafers.

Figure 2:
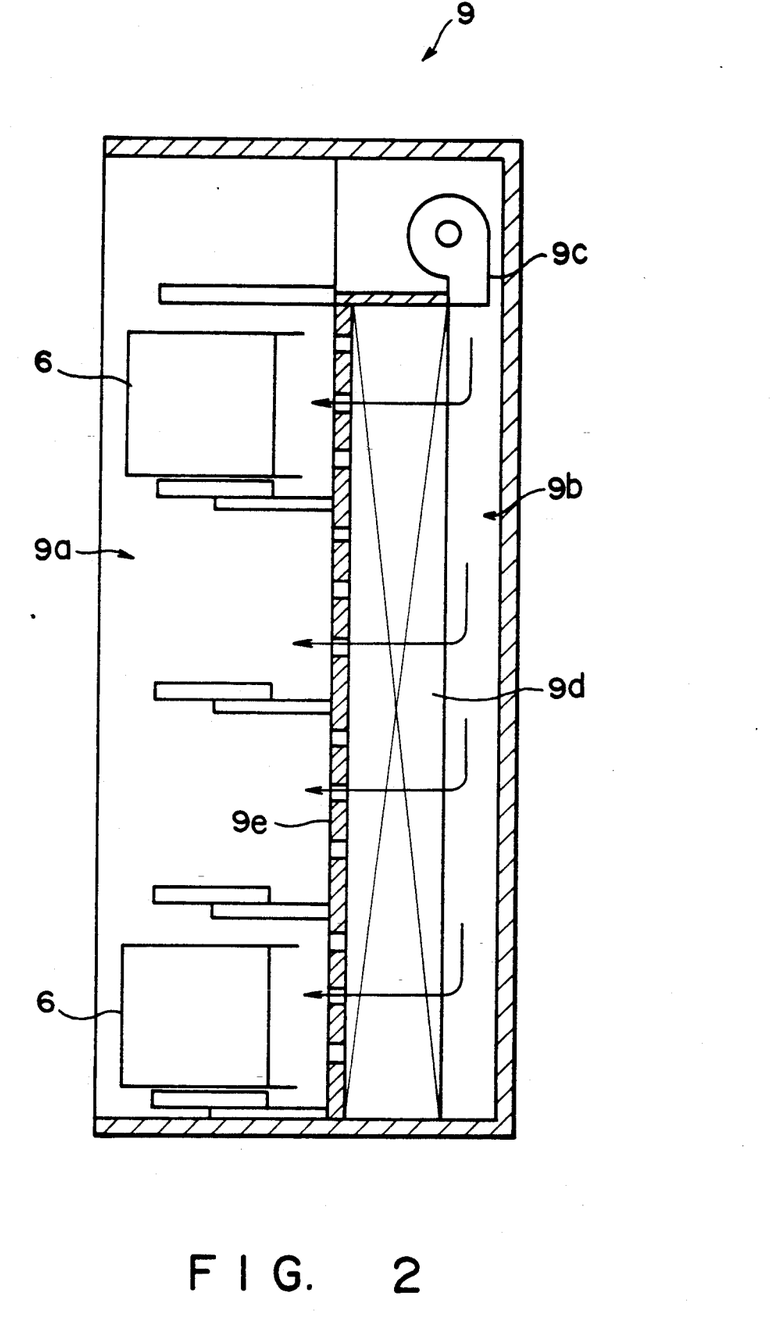
FIG. 2 is a longitudinal cross-sectional view of the main portion of the vertical heat treating apparatus shown in FIG. 1.

The carrier stage 9 comprises a front portion and a rear portion formed integral therewith. The front portion is a shelf-like carrier storing portion 9a divided into a plurality of chambers (eight chambers, in total, arranged in two columns and four steps in this embodiment), and the rear portion is a clean-air-flow formation unit 9b. As shown in FIG. 2, the air-flow formation unit 9b comprises a fan 9c provided in the upper portion, and a dust filter 9d provided under the fan 9c. Between the carrier storing portion 9a and the air-flow formation unit 9b is prepared a punch metal member 9e for conducting purified air passing through the dust filter 9d into the carrier storing portion 9a.

The wafer cassettes 6 transported in the casing 1 are put in the carrier storing portion 9a. Then, air is blown in the air-flow unit 9b from thereover and cleaned by the dust filter 9d. Since the purified air hits against the semiconductor wafers in the wafer cassettes 6, no dust is attached to the wafers in the cassettes 6. If air is blown in parallel with the wafers in the cassettes 6, the efficiency such as preventing dust from attaching to the wafers can be improved.

A side portion (the front portion in FIG. 2) of the vertical heat treating furnace 2 in the casing 1, which is dead space in the conventional heat treating apparatus, can be effectively used as a space for the carrier stage 9 in this embodiment. The upper portion of the casing 1 does not contain any mechanical driving device, and is the portion whose atmosphere is relatively clean. By accommodating the wafer cassettes 6 in this portion, therefore, dust is not attached to the semiconductor wafers in the wafer cassettes 6.

The transfer stage 10 is designed to hold a plurality of cassettes (two, for example) in a state in which they are accurately positioned. The semiconductor wafers are transferred between the wafer cassettes 6 held on the transfer stage 10 and the wafer boat 3 mounted on the boat elevator 4. In order to transport the wafer cassettes 6 by means of the first robot arm 8 and the semiconductor wafers by means of the second robot arm 11, the carrier stage 9 and the transfer stage 10 are adjustable with respect to these driving devices. These positional adjustments must be made before the operation of the apparatus starts. Since the articles to be transported are different from each other, the positional accuracy of the second robot arm 11 is required to be higher than the positional accuracy of the first robot arm 8.

In this respect, the positional adjustment of the transfer stage 10 requires more time than the positional adjustment of the carrier stage 10. In this embodiment, however, the transfer stage 10 is designed to hold only two wafer cassettes 6, and thus its positional adjustment is relatively simply performed.

If the transfer stage 10 were adapted to hold many wafer cassettes 6 (eight, for example) the positional adjustment would be very difficult, and a large space would be required for locating the transfer stage 10, leading to a bulky structure of the apparatus. Since this structure would need many driving devices, the semiconductor wafers would stay in the lower portion of the casing 1 in which the atmosphere would be not so clean, and dust would accordingly be easily attached to them. This is not preferable. In relation to the storing ability of the wafer boat 3, it is more suitable that the number of the wafer cassettes 6 are less than four.

If, on the other hand, the transfer stage 10 were designed to hold only one wafer cassette 6, the transferring operation of semiconductor wafers by the second robot arm 11 would be interrupted during the change of the wafer cassette 6, lowering the processing efficiency. In contrary, when two wafer cassettes 6 are loaded on the transfer stage 10, semiconductor wafers can be transferred from one of the water cassettes 6 to the wafer boat while the other wafer cassette is being changed.

It is, therefore, the most preferable that the transfer stage 10 is designed to carry two wafer cassettes 6.

Figure 3:
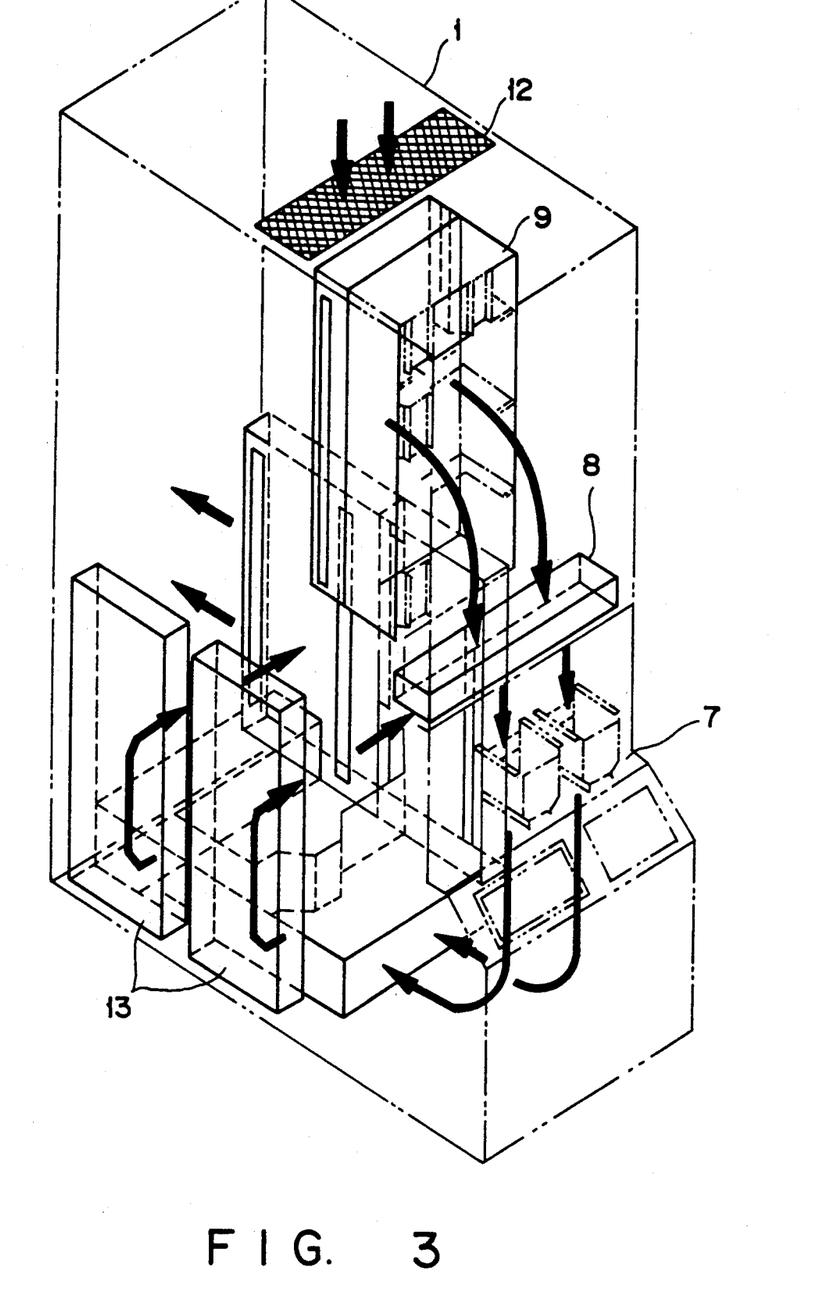
FIG. 3 is a view illustrating how air flows in the vertical heat treating apparatus shown in FIG. 1.

Besides the carrier stage 9, a cleaning unit 13 having a fan (not shown) and a dust filter (not shown) are placed in a side portion of the boat elevator 4 and the second robot arm 11. As shown in FIG. 3, air conducted from an opening 12 formed in the ceiling of the casing into the casing 1 is caused to flow from the upper portion toward the lower portion and passes the carrier stage 9, the first robot arm 8 and the carrier I/O port 7 in turn. The air causes a purified air flow such that the air passes the boat elevator 4, the second robot arm 11 and the transfer stage 10 after it has entered a portion under the floor, whereby dust fails to be adhered to the semiconductor wafers.

The operation of the vertical heat treating apparatus will now be explained.

The heat treating furnace 2 is heated to a predetermined temperature according to the process to be performed, in advance. The fan 9c provided in the carrier stage 9 and the fans provided in the other parts are driven, and purified air flows are formed in the casing 1, as shown by arrows in FIG. 3. Of the wafer cassettes 6 containing a plurality of (25, for example) semiconductor wafers having a diameter of 8 inches, for example, as articles to be processed, two wafer cassettes 6 are transported by means of a transport robot, for example, to the predetermined positions on the carrier I/O port 7, every time the transportation is carried out.

In the vertical heat treating apparatus, the semiconductor wafers in the wafer cassettes 6 are arranged in the predetermined direction by means of a wafer arranging mechanism (not shown), and then the wafer cassettes 6 are rotated by means of a horizontal-vertical direction changing mechanism (not shown) so as to be erected vertically and face backward (in such a manner that the semiconductor wafers are positioned horizontally). The wafer cassettes 6 are transported by means of the first robot arm 8 and are held by the carrier stage 9.

Thereafter, the wafer cassettes 6 on the carrier stage 9 are moved to the transfer stage 10 in succession, and the semiconductor wafers in the wafer cassettes 6 are transferred by means of the second robot arm 11 to the wafer boat 3 mounted on the boat elevator 4.

After the transfer of the required number (150, for example) of the semiconductor wafers has been completed, the boat elevator 4 is lifted, and the wafer boat 3 which is preheated is loaded in the heat treating furnace 2. The required heat treatment (for example, diffusion, forming an oxide layer, CVD and the like) is performed for a predetermined time, at a predetermined temperature and in a predetermined atmosphere in accordance with a predetermined program. After the processing has been completed, the supply of the processing gas is stopped as well as the heat processing temperature in the furnace 2 is lowered to a predetermined temperature. After the pressure and the temperature in the furnace 2 have been lowered to the common pressure and the common temperature, the processed semiconductor wafers are unloaded according to the steps reverse to the steps of loading. Then, the opening of the furnace 2 is closed by means of a shutter 14 to prevent the heat radiation.

As explained above, the vertical heat treating apparatus is constructed such that the carrier stage 9 having the clean-air-flow formation unit 9b is provided in that upper portion of the casing 1 in which an atmosphere is cleaner than the lower portion at the side of the heat treating furnace, and wafer cassettes 6 are accommodated in the carrier stage 9 during the waiting time of the process. This structure ensures that dust is prevented from being attached to semiconductor wafers by an air flow which is generated when the wafer boat is unloaded, and the yield of products is enhanced.

Although the carrier stage 9 must be adjusted with respect to the first robot arm 8, as described above, the integral structure of the carrier storing portion 9a with the clean-air-flow formation unit 9b prevents the displacement therebetween and air leakage, at the time of positional adjustment of the carrier stage 9.

In this invention, the carrier stage 9 is provided in a space at a side of the heat treating furnace, which space is a dead space in the conventional vertical heat treating apparatus. Thus, the floor space can be reduced in a vertical heat treating apparatus according to this invention which is designed to process semiconductors having a large diameter such as 8 inches.

Explanation will now be made to the heat treating furnace provided in the vertical heat treating apparatus according to this invention.

As shown in FIG. 1, a substantially horizontal base plate 20 is provided at a predetermined height in the rear portion in the casing 1. The heat treating furnace 2 of a cylindrical form extends substantially vertically from the upper surface of the base plate 20.

Figure 4:
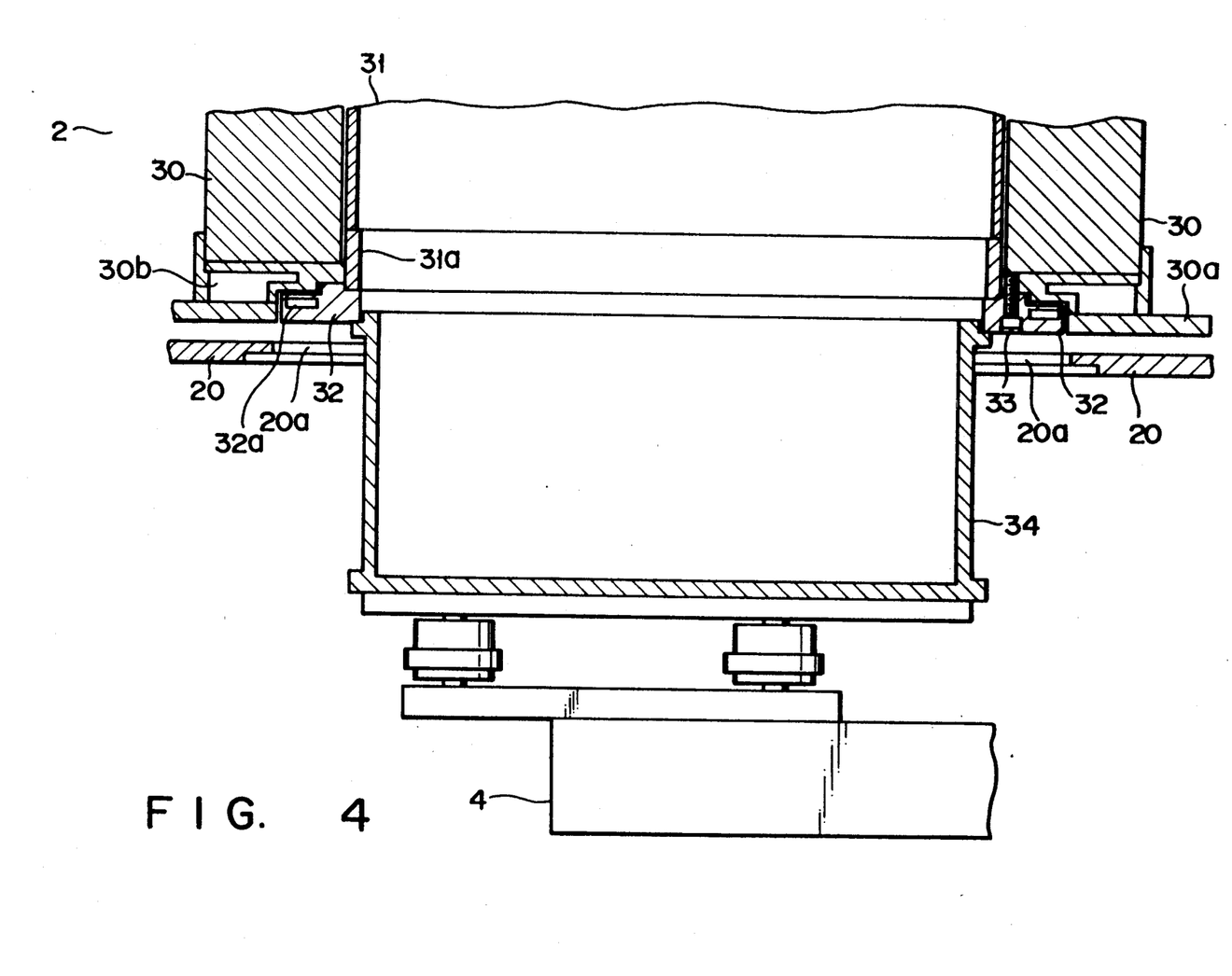
FIG. 4 is a transverse cross-sectional view of the main portion of the vertical heat treating apparatus shown in FIG. 1.

As shown in FIG. 4, the heat treating furnace 2 comprises a cylindrical heater 30 which constitutes the outermost member of the furnace 2, a cylindrical evenly heating tube 31 made of SiC or the like and provided at the inner side of the outer heater 30, and a cylindrical process tube (reaction tube) (not shown) made of quartz or the like and provided at the inside of the evenly heating tube 31.

A circular opening 20a is formed in the base plate 20. The heater 30 has a rectangular flange 30a fixed onto its bottom so as to be disposed over the circular opening 20a of the base plate 20 at a predetermined distance such as 20 mm. The evenly heating tube 31 is inserted at the lower portion of the base plate 20 in the heater 30 through the circular opening 20a, and is placed on an annular member 31a made of heat resistive and heat insulating material such as $SiO_2$ and $Al_2O_3$. The annular member 31a is mounted on a ring member 32 made of stainless steel, for example. The ring member 32 is fixed to the heater 30 by means of a plurality of bolts 33 or the like.

Although the portion where the evenly heating tube 31 is present is heated to a predetermined high temperature such as 1,000° by means of the heater 30, the use of the annular member 31a renders low the temperature of the portion where the fixing member 32 exists, for example, 100° C. or less. Cooling portions 32a and 30b which conduct cooling water are provided for continuing to cool the corresponding fixing member 32 and the flange 30a to a lower temperature such as 500° C. or less.

The circular opening 20a of the base plate 20 has a diameter larger than the outer diameters of the evenly heating tube 31 and the fixed member 32 such that the evenly heating tube 31 can be inserted at the undersurface of the base plate 20 in the heater 30. Under the heat treating furnace 2, as shown in FIG. 1, there is provided the boat elevator 4 for receiving the wafer boat 3 receiving semiconductor wafers (not shown) as articles to be processed. When, therefore, as shown in FIG. 4, the evenly heating tube 31 is inserted in the heater 30 and removed therefrom, the evenly heating tube 31 can be moved up and down by using the boat elevator 4 with an evenly heating tube setting member 34. The evenly heating tube 31 is moved up and down when the heat treating furnace 2 is assembled or the maintenance thereof is performed.

Figure 5:
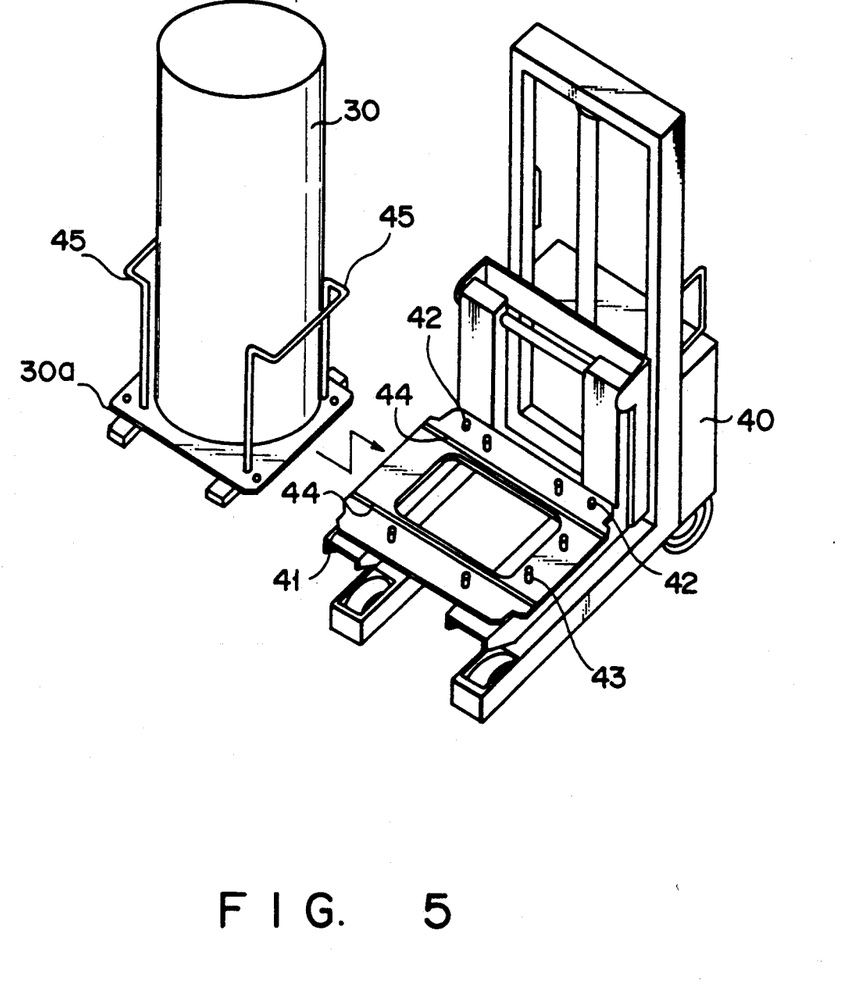
FIGS. 5 to 9 are views illustrating how to mount an evenly heating tube of the vertical heat treating apparatus shown in FIG. 1.

The heater 30 is mounted on the base plate 20 by means of a heater setting member 41 fixed onto a lifter 40 by means of a plurality of (two, for example) bolts 42, as shown in FIG. 5. On the upper surface of the heater setting member 41 are provided guide pins 43 arranged in conformity with the shape of the flange 30a of the heater 30, and slide guides 44 made from tape-shape members made of rigid resin or the like. A removable handle 45 is fixed to the heater 30.

Figure 6:
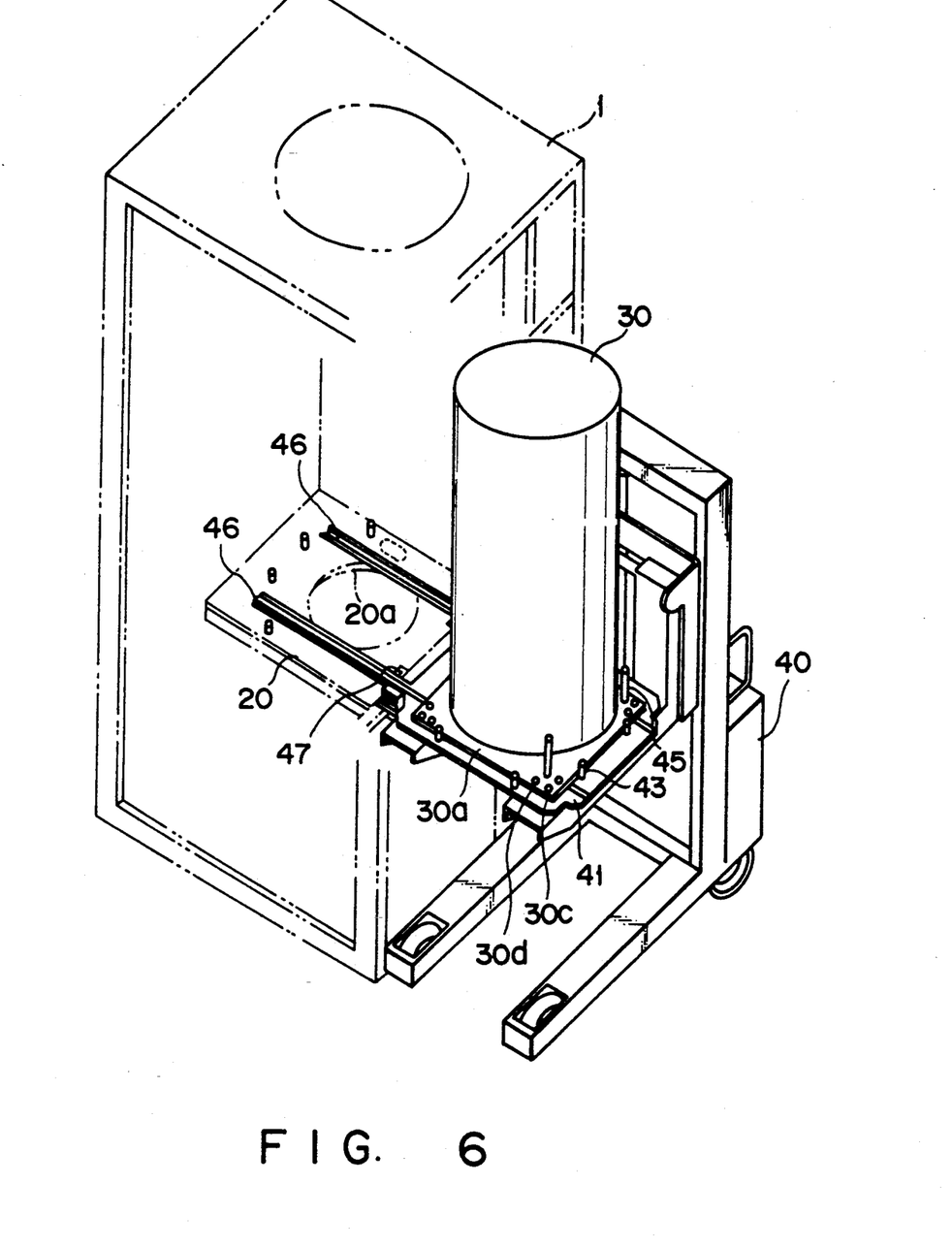
Figure 7:
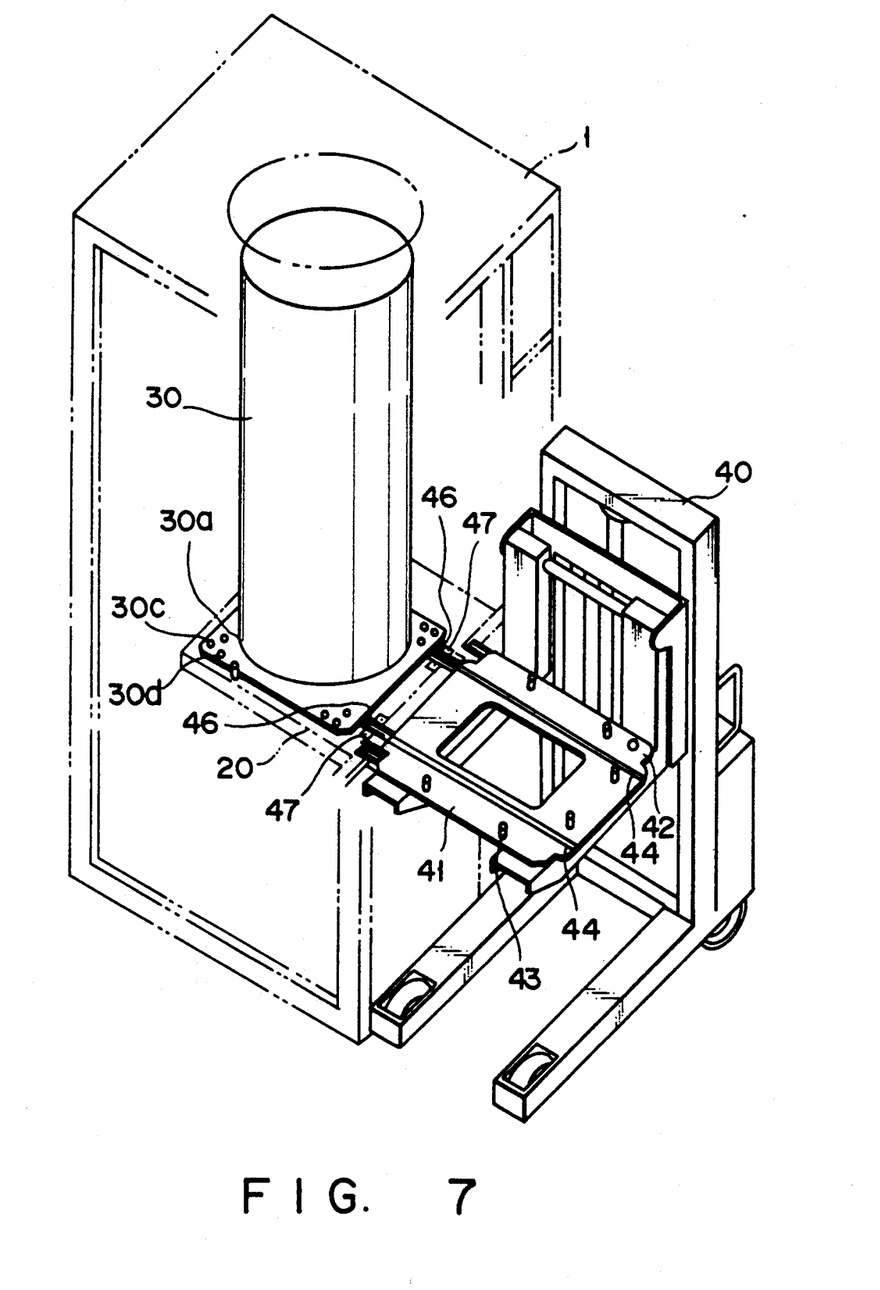

As shown in FIG. 6, the lifter 40, on which the heater 30 provided on the heater setting member 41 is mounted, is moved to a side portion of the opening formed in the rear face or a side face of the casing 1 of the vertical heat treating apparatus. Then, the lifter 40 is fixed to this portion. Thereafter, the heater 30 is raised by the lifter 40 to a required level. Slide members 46 are previously fixed to the base plate 20 of the casing 1 by bolts 47 so as to align with the slide guides 44 of the heater setting member 41, when the heater 30 is raised to the required level. Similarly to the slide guides 44, the slide members 46 are tape members made of rigid resin, for example, adhered to a plate member made of metal, for example. As shown in FIG. 7, the heater 30 is caused to slide until it arrives at a required position in the casing 1, and the handle 45 is removed.

Figure 8:
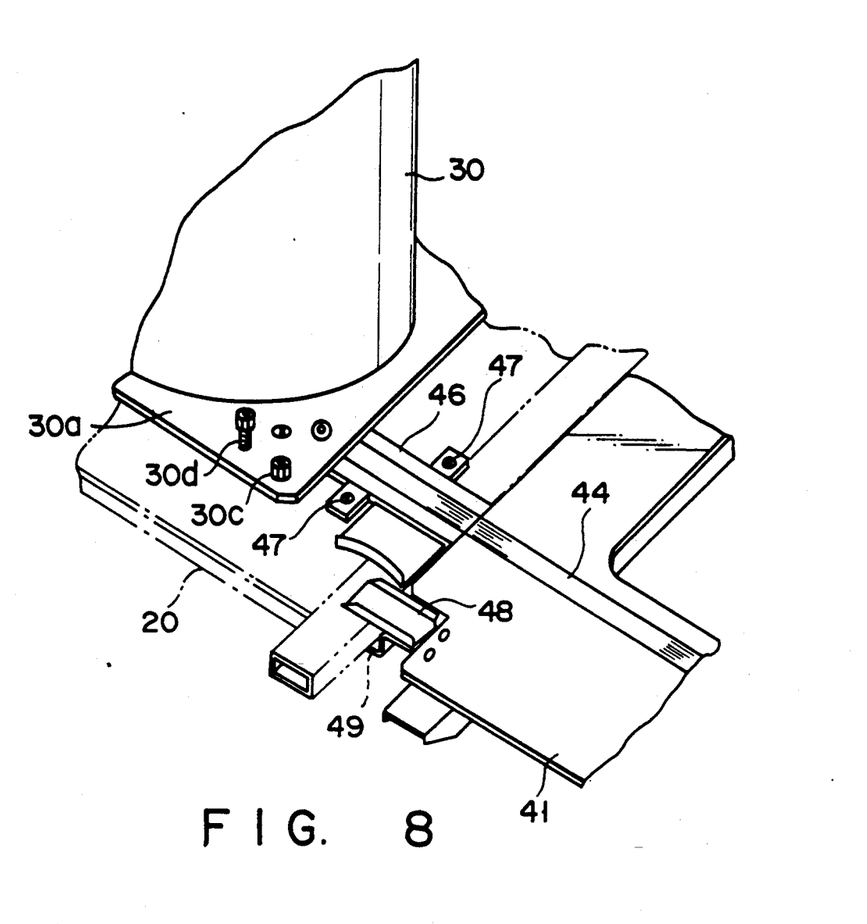

As shown in FIG. 8, four leveling bolts 30d are engaged in the four corners of the flange 30a of the heater 30 to lift the heater 30 slightly, and the slide members 46 are removed in this state. Thereafter, the heater 30 is set in position by means of the leveling bolts 30d and fixed onto the base plate 20 by means of fixing bolts 30c.

Figure 9:
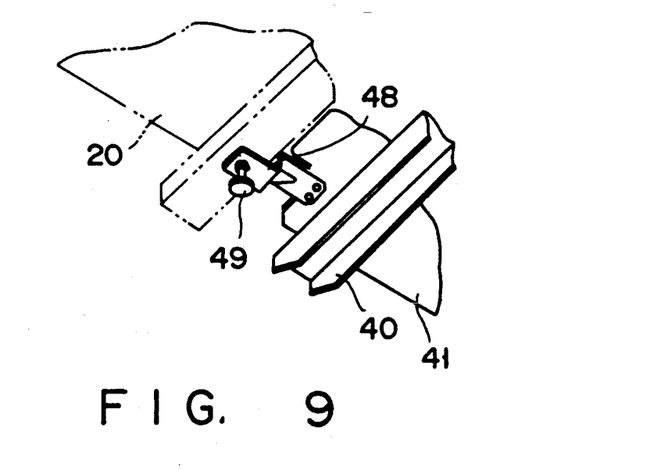

As shown in FIGS. 8 and 9, the heater setting member 41 is fixed to the casing 1 by fitting, on the frame of the casing 1, a fixture 48 having a U-shaped cross section and provided on the front end portion of the heater setting member 41 and by fixing bolts 49 to the frame at the rear face of the fixture 48.

As shown in FIG. 4, the removal and the attachment of the evenly heating tube 31 for maintenance can be performed at the undersurface of the base plate 20 without removing the heater 30 from the casing 1. Accordingly, it is unnecessary in this invention to attach the evenly heating tube 31 to and take the same out of the casing after removing the heater 30 from the casing 1 and suspending the same at the outside of the casing 1 by means of a suspension mechanism, like the conventional apparatus. In this respect, the maintenance of this invention is easier than the maintenance of the conventional apparatus.

In particular, when semiconductor wafers having a diameter of 8 inches are processed, the evenly heating tube 31, the heater 30 and the other members and parts are rendered large. However, the maintenance of the vertical heat processing apparatus for processing 8-inch semiconductor wafers is easily performed due to the facts as mentioned above.

Since it is necessary to suspend the heater 30 at the outside of the heater 30 when the attachment of the evenly heating tube 31 is effected, the heater 30 can be set in the casing 1 by means of the lifter 40, the heater set member 41, etc., whereby the manufacturing cost can be reduced.

This invention is not limited to the above-mentioned embodiment, but applicable to various modifications which are not departed from the scope of this invention.

What is claimed is:

1. A vertical heat treating apparatus comprising;
a casing having an opening through which a plurality of transport members are loaded in and unloaded from said casing, said transport members each receiving a plurality of articles to be processed, said casing having an upper portion;
a heat treating furnace provided in said upper portion of said casing;
transport member storing means provided in the upper portion of said casing at a side space of said heat treating furnace, for storing said transport members at the same time;
processing means for transporting said articles to be processed in said heat treating furnace;
transferring means for transferring the articles received by said transport members to said processing means; and
vertically moving means provided below said heat treating furnace in said lower portion of the casing, for moving the processing means, thereby loading and unloading said articles received by said processing means in and from said heat treating furnace.

2. The apparatus according to claim 1, further comprising a transfer stage for temporarily storing a least one of said transport members transported from said transport member storing means and wherein said transferring means transfers said articles to be processed to said processing means.

3. The apparatus according to claim 2, wherein said transfer stage has supporting surfaces for respectively supporting at least two of said transport members.

4. The apparatus according to claim 1, wherein said transport member storing means has means for holding eight of said transport members.

5. The apparatus according to claim 2, wherein said transferring means comprises a first robot arm for transferring said transport members to said transfer stage and a second robot arm for transferring said articles to be processed from said transport members on said stage to said processing means.

6. The apparatus according to claim 1, wherein said transport member storing means has clean-air-flow formation means for hitting flow of clean air against said transport members stored in said transport member storing means, said clean-air-flow formation means having a fan and a dust filter.

7. The apparatus according to claim 1, which further comprises a base plate provided in said casing, and wherein said heat treating furnace is substantially vertically provided on said base plate and comprises an evenly heating tube having a lower end formed with an opening through which said articles to be processed are loaded in and unloaded from said heat treating furnace and a heater surrounding said evenly heating tube.

8. The apparatus according to claim 1, wherein said transport members are adapted to receive semiconductor wafers, each having a diameter of eight inches.

9. The apparatus according to claim 7, wherein said evenly heating tube has a diameter and said base plate has an circular opening having a diameter larger than the diameter of said evenly heating tube.

10. The apparatus according to claim 7, further comprising a heat resistive annular ring for holding said evenly heating tube in said heater.

11. The apparatus according to claim 7, further comprising supporting means for supporting said evenly heating tube and said heater on said base plate, and cooling means for cooling said supporting means.

12. A vertical heating apparatus comprising:
(a) a base plate;
(b) a heat treating furnace provided substantially vertically on said base plate and comprising:
(c) a cylindrical evenly heating tube having a lower end formed with an opening through which articles to be processed are loaded in an unloaded from said cylindrical evenly heating tube, and
a heater surrounding said evenly heating tube;
(c) attaching and detaching means for attaching said evenly heating tube in and detaching said evenly heating tube from said heater at an underside of said base plate;
(d) a casing having an opening through which a plurality of transport members are loaded in and unloaded from said casing, said transport members each receiving a plurality of articles to be progressed, said casing having an upper portion, said heat treating furnace being provided in said upper portion of said casing;

(e) transport member storing means provided in the upper portion of said casing at a side space of said heat treating furnace, or storing said transport members at the same time;

(f) processing means for transporting said articles to be processed in said heat treating furnace;

(g) transferring means for transferring the articles received by said transport members to said processing means; and (h) vertically moving means provided below said heat treating furnace in said lower portion of the casing, for moving the processing means, thereby loading and unloading said articles received by said processing means in and from said heat treating furnace.

13. The apparatus according to claim 12, wherein said evenly heating tube has a diameter and said base plate has a circular opening having a diameter larger than the diameter of said evenly heating tube.

14. The apparatus according to claim 12, wherein said attaching and detaching means includes vertically moving means provided below said heat treating furnace for loading and unloading said articles to be processed in and from said heat treating furnace.

15. The apparatus according to claim 12, further comprising an annular member for holding said evenly heating tube in said heater.

16. The apparatus according to claim 12, further comprising supporting means for supporting said evenly heating tube and said heater on said base plate, and cooling means for cooling said supporting means.

17. The apparatus according to claim 3, wherein said transferring means transfers the articles to be processed received by one of the transport members supported by one supporting surface of the transfer stage during the transport member which has received processed articles and is supported by the other supporting surface of the transfer stage is exchanged to the transport member which has received articles to be received.

18. A vertical heat treating apparatus comprising:
a casing having an opening through which a plurality of transport members are loaded in and unloaded from said casing, said transport members each receiving a plurality of articles to be processed, said casing having an upper portion and a lower portion;
a heating treating furnace provided in said upper portion of said casing;
transport member storing means provided in the upper portion of said casing at a side space of said heat treating furnace, and including a plurality of carrier storing portions each storing the transport member;
processing means for transporting said articles to be processed in said heat treating furnace;
first transferring means for transferring said articles received by said transport member to said processing means; and
second transferring means for transferring at least one of the transport members stored in the carrier storing portions to the first transferring means.

19. The apparatus according to claim 3, wherein said carrier storing members are arranged along a horizontal plane in the casing.

20. The apparatus according to claim 3, wherein said carrier storing members are arranged along a vertical plane in the casing.

21. A vertical heat treating apparatus comprising:
a casing having an opening through which a plurality of transport members are loaded in and unloaded from said casing, said transport members receiving articles to be processed, said casing having an upper portion;
a heat treating furnace provided in said upper portion of said casing;
transport member storing means provided in said casing at a side space of said heat treating furnace, for receiving said transport members;
processing means for transporting said articles to be processed in said heat treating furnace;
transferring means for transferring said articles received by said transport members to said processing means; and
vertically moving means provided below said heat treating furnace in said casing, for loading and unloading said articles received by said processing means in and from said heat treating furnace;
wherein said transport member storing means has means for holding eight of said transport members.

22. A vertical heat treating apparatus comprising:
a casing having an opening through which a plurality of transport members are loaded in and unloaded from said casing, said transport members receiving articles to be processed, said casing having an upper portion;
a heat treating furnace provided in said upper portion of said casing;
transport member storing means provided in said casing at a side space of said heat treating furnace, for receiving said transport members;
processing means for transporting said articles to be processed in said heat treating furnace;
transferring means for transferring the articles received by said transport members to said processing means;
vertically moving means provided below said heat treating furnace in said casing, for loading and unloading said articles received by said processing means in and from said heat treating furnace; and
a transfer stage for temporarily storing said transport members transported form said transport member storing means and transferring said articles to be processed to said processing means;
wherein said transferring means comprises a first robot arm for transferring said transport members to said transfer stage and a second robot arm for transferring said articles to be processed from said transport members on said stage to said processing means.

23. A vertical heat treating apparatus comprising:
a casing having an opening through which a plurality of transport members are loaded in and unloaded from said casing, said transport members receiving articles to be processed, said casing having an upper portion;
a heating furnace provided in said upper portion of said casing;
a transport member storing means provided in said casing at a side space of said heat treating furnace, for receiving said transport members;
processing means for transporting said articles to be processed in said heat treating furnace;
transferring means for transferring the articles received by said transport members to said processing means; and vertically moving means provided below said heat treating furnace in said casing, for loading and unloading said articles received by said processing means in and from said heat treating furnace;

wherein said transport member storing means has clean-air-flow formation means for hitting flow of clean air against said transport members stored in said transport member storing means, said clean-air-flow formation means having a fan and a dust filter.

* * * * *